(12) United States Patent
Jong et al.

(10) Patent No.: US 12,334,966 B2
(45) Date of Patent: Jun. 17, 2025

(54) ROBUST SATELLITE BEACON RECEIVER

(71) Applicant: Hughes Network Systems, Germantown, MD (US)

(72) Inventors: James Jehong Jong, North Potomac, MD (US); Pablo Valle, San Diego, CA (US)

(73) Assignee: Hughes Network Systems, LLC, Germantown, MD (US)

( * ) Notice: Subject to any disclaimer, the term of this patent is extended or adjusted under 35 U.S.C. 154(b) by 399 days.

(21) Appl. No.: 18/067,095

(22) Filed: Dec. 16, 2022

(65) Prior Publication Data
US 2024/0039567 A1    Feb. 1, 2024

Related U.S. Application Data

(60) Provisional application No. 63/370,073, filed on Aug. 1, 2022.

(51) Int. Cl.
*H04B 1/10* (2006.01)
*H03F 1/32* (2006.01)

(52) U.S. Cl.
CPC ......... *H04B 1/1036* (2013.01); *H03F 1/3247* (2013.01)

(58) Field of Classification Search
CPC .......................... H04B 1/1036; H03F 1/3247
See application file for complete search history.

(56) References Cited

U.S. PATENT DOCUMENTS

| 4,578,678 | A  | * | 3/1986 | Hurd | G01S 19/29 |
| | | | | | 342/357.77 |
| 6,738,713 | B2 | * | 5/2004 | Pratt | G01S 19/49 |
| | | | | | 701/485 |
| 7,177,376 | B2 | * | 2/2007 | Atungsiri | H04L 27/2695 |
| | | | | | 375/362 |
| 7,388,541 | B1 | * | 6/2008 | Yang | G01C 21/206 |
| | | | | | 342/464 |

(Continued)

FOREIGN PATENT DOCUMENTS

CN           102546484 A         7/2012

OTHER PUBLICATIONS

International Search Report for PCT Application No. PCT/US2023/070794.

(Continued)

*Primary Examiner* — Kabir A Timory
(74) *Attorney, Agent, or Firm* — Capitol City TechLaw; Jasbir Singh

(57) ABSTRACT

A beacon receiver including: a Digital Fourier Transform (DFT) module including bins to acquire and to track a beacon signal; an acquisition processor to find acquisition frequency estimates of the beacon signal, to improve the acquisition frequency estimates with a generalized complex interpolator and to linearize the acquisition frequency estimates; and a tracking filter to track the acquired beacon signal and to calculate a tracking frequency estimates; and a synchronization manager to apply a frequency correction, to an oscillator, based on the acquisition frequency estimates or the tracking frequency estimates, wherein the DFT module uses a first bin size for the bins to acquire, a second bin size for the bins to track, and the first bin size is greater than the second bin size.

20 Claims, 9 Drawing Sheets

(56) References Cited

U.S. PATENT DOCUMENTS

2010/0195563 A1   8/2010   Jong et al.

OTHER PUBLICATIONS

Nezami M K et al: "DFT-based frequency acquisition algorithm for large carrier offsets in mobile satellite receivers", Electronics Letters, The Institution of Engineering and Technology, GB, vol. 37, No. 6, Mar. 15, 2001, (Mar. 15, 2001), pp. 386-387, XP006016388, ISSN: 0013-5194, DOI: 10.1049/EL:2001267 the whole document.

* cited by examiner

ROBUST SATELLITE BEACON RECEIVER

CROSS-REFERENCE TO RELATED APPLICATIONS AND INCORPORATION BY REFERENCE

The present application claims the benefit under 35 U.S.C. 119(e) of U.S. Provisional Application Ser. No. 63/370,073 filed Aug. 1, 2022, which is incorporated herein by reference in its entirety.

FIELD

A pilot beacon receiver using a common Digital Fourier Transform (DFT) module for acquisition and tracking of a pilot/beacon is disclosed. The receiver provides finer estimation using a generalized complex interpolator and operates at a very low Signal-to-Noise Ratio (SNR), for example, a negative SNR. The receiver also handles an outage with and without redundancy. The receiver provides reliable frequency in the presence of impairments. The receiver may handle multiple beacons to improve system availability.

BACKGROUND

Ground equipment can be frequency synchronized with respect to a satellite using beacon signals. The satellite transmits beacon signals to aid group equipment synchronization between gateways, satellites and terminals. The channel between the satellite and ground equipment can be impaired by atmospheric loss at high frequency, for example, in the Ka-band. Severe attenuation of a beacon signal can lead into an outage. Attenuation or impairment of the channel can also be caused by phase noise.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

The present receiver provides a wide range of receive frequency aperture for a Continuous Wave (CW) signal. Robust performance is provided in the presence of phase noise and a low SNR, for example, a negative SNR. Embodiments of the receiver may handle an outage of beacon reception with redundancy.

In some aspects, the techniques described herein relate to a beacon receiver including: a Digital Fourier Transform (DFT) module including bins to acquire and to track a beacon signal; an acquisition processor to find acquisition frequency estimates of the beacon signal, to improve the acquisition frequency estimates with a generalized complex interpolator and to linearize the acquisition frequency estimates; and a tracking filter to track the acquired beacon signal and to calculate a tracking frequency estimates; and a synchronization manager to apply a frequency correction, to an oscillator, based on the acquisition frequency estimates or the tracking frequency estimates, wherein the DFT module uses a first bin size for the bins to acquire, a second bin size for the bins to track, and the first bin size is greater than the second bin size.

In some aspects, the techniques described herein relate to a beacon receiver, wherein the first bin size is greater than 6 Hz.

In some aspects, the techniques described herein relate to a beacon receiver, wherein a frequency correction error of the first bin size is greater than 0.1 Hz when the beacon signal has a frequency range of +/−1.5 kHz.

In some aspects, the techniques described herein relate to a beacon receiver, further including a Square Root Raised Cosine (SRRC) filter operating on a beacon symbol in the beacon signal at a symbol rate that is an integer multiple of a beacon symbol rate.

In some aspects, the techniques described herein relate to a beacon receiver, further including a Generalized Complex Lagrange (GCL) interpolator to improve the tracking frequency estimates.

In some aspects, the techniques described herein relate to a beacon receiver, wherein the acquisition processor improves the acquisition frequency estimates with a Generalized Complex Lagrange (GCL) interpolator.

In some aspects, the techniques described herein relate to a beacon receiver, further including a Signal-Noise Ratio (SNR) estimator to provide an SNR estimate to the acquisition processor.

In some aspects, the techniques described herein relate to a beacon receiver, further including a control to detect loss of the beacon signal and an SNR estimator to provide an SNR estimate to the control.

In some aspects, the techniques described herein relate to a beacon receiver, further including a control to restore a last known good state for the acquisition processor when transitioning from an outage.

In some aspects, the techniques described herein relate to a beacon receiver, further including a beacon redundancy module, wherein the beacon signal includes redundant beacon signals, and a control to switch from a first beacon signal of the redundant beacon signals to a second beacon signals of the redundant beacon signals, when an outage of the first beacon signal is detected.

In some aspects, the techniques described herein relate to a beacon receiver, wherein the DFT module to acquire the beacon signal and the DFT module to track the beacon signal are same.

In some aspects, the techniques described herein relate to a beacon receiver, wherein the tracking filter is a first order filter having an $\alpha$ feedback control set to 0.1.

In some aspects, the techniques described herein relate to a beacon receiver, wherein the beacon signal includes a beacon symbol rate of 23.4 kilo symbols per second (ksps) signal, wherein the beacon signal includes a frame having a duration of less than or equal to 100 ms.

In some aspects, the techniques described herein relate to a beacon receiver, wherein the first bin size is 30 Hz, and wherein the second bin size is 1 Hz.

In some aspects, the techniques described herein relate to a beacon receiver, wherein the beacon signal includes a satellite beacon signal.

In some aspects, the techniques described herein relate to a beacon receiver, including a Received Signal Strength Indicator (RSSI) estimator to provide a linearized RSSI estimate, wherein the RSSI estimator operates at a signal rate of the beacon signal.

In some aspects, the techniques described herein relate to a method for receiving a beacon signal including: transforming, to acquire and to track, the beacon signal using a Digital Fourier Transform (DFT) module including bins; acquiring the beacon signal by finding acquisition frequency estimates of the beacon signal, improving the acquisition frequency estimates using generalized complex interpolator, and linearizing the acquisition frequency estimates; tracking the acquired beacon signal and calculating a tracking frequency estimates; and synchronizing an oscillator by applying a frequency correction based on the acquisition frequency estimates or the tracking frequency estimates, wherein the DFT module uses a first bin size for the bins for the acquiring, a second bin size for the bins for the tracking, and the first bin size is greater than the second bin size.

In some aspects, the techniques described herein relate to a method, wherein the generalized complex interpolator includes a Generalized Complex Lagrange (GCL) interpolator.

In some aspects, the techniques described herein relate to a method, further including improving the tracking frequency estimates using a Generalized Complex Lagrange (GCL) interpolator.

In some aspects, the techniques described herein relate to a method, wherein a DFT module for acquiring the beacon signal and a DFT module for tracking the beacon signal are same.

In some aspects, the techniques described herein relate to a method, wherein the beacon signal includes redundant beacon signals, and the method further includes switching from a first beacon signal of the redundant beacon signals to a second beacon signals of the redundant beacon signals, when an outage of the first beacon signal is detected.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

Figure 1A:
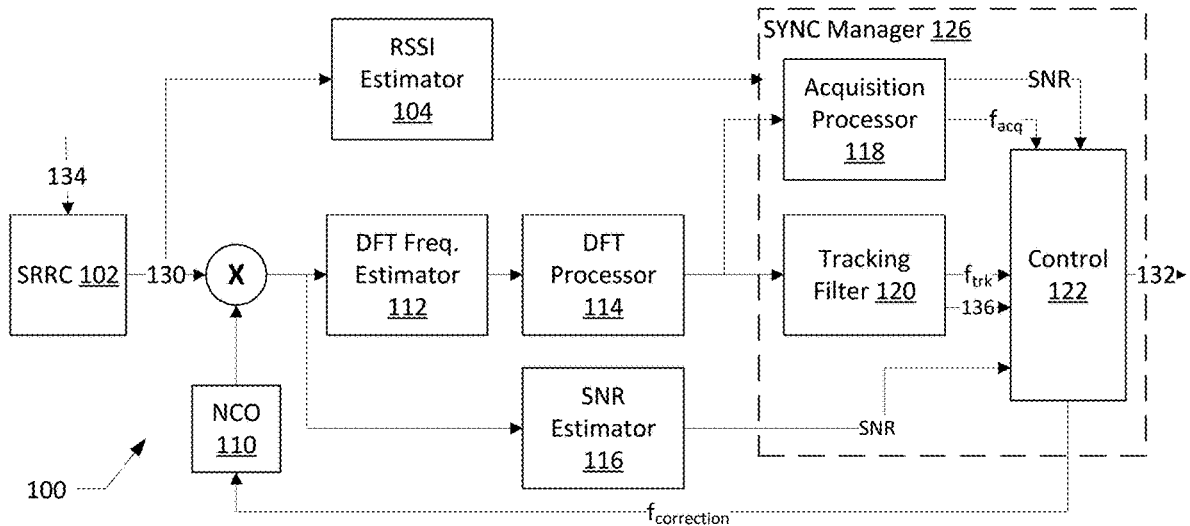
FIG. 1A illustrates a beacon receiver according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Embodiments are discussed in detail below. While specific implementations are discussed, this is done for illustration purposes only. A person skilled in the relevant art will recognize that other components and configurations may be used without parting from the spirit and scope of the subject matter of this disclosure.

The terminology used herein is for describing embodiments only and is not intended to be limiting of the present disclosure. As used herein, the singular forms "a," "an" and "the" are intended to include the plural forms as well, unless the context clearly indicates otherwise. Furthermore, the use of the terms "a," "an," etc. does not denote a limitation of quantity but rather denotes the presence of at least one of the referenced items. The use of the terms "first," "second," and the like does not imply any order, but they are included to either identify individual elements or to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

The present receiver provides a wide range of receive frequency aperture for a Continuous Wave (CW) signal. The receiver offers a simpler implementation by using the same DFT with small number of bins, for acquisition and tracking, and using complex interpolation to improve frequency accuracy. Robust performance is provided under phase noise and low SNR, for example, a negative SNR. Embodiments of the receiver may handle outage of beacon reception with redundancy, for example. In some embodiments, the beacon source may provide primary and redundancy beacon signals separated from one another, for example, by 60 MHz in the Ka band. The beacon signals may be frequency locked to a payload MRO (Master Reference Oscillator) at a beacon source, such as a satellite gateway. As such, any drift in MRO frequency will be reflected in the beacon carrier frequency. The beacon source may be a satellite or a satellite gateway.

The receiver provides accurate frequency estimation using a DFT based module. The acquisition range of the receiver may be +/−1.5 kHz. The frequency tracking range of the receiver may be +/−50 Hz. The beacon receiver may provide frequency, SNR and RSSI estimates. The beacon signal may be a 23.4 kilo symbols per second (ksps) signal. The input to the beacon receiver may be the output of a Square Root Raised Cosine (SRRC) filter operating on the beacon samples, for example, at 4× the symbol rate (4×23.4 ksps). The beacon receiver processes configurable worth of data, for example, a 40 ms frame. This duration maybe configured for a shorter or longer period depending on a target operation SNR and frequency drift rate.

FIG. 1A illustrates a beacon receiver according to various embodiments.

A beacon receiver 100 may provide a beacon signal 134 to a SRRC filter 102 to generate a received signal 130 at 4× symbol rate. In some embodiments, the beacon signal 134 is a CW waveform transmitted by a satellite at Ka band to help a gateway to achieve frequency synchronization. The beacon receiver 100 acquires the beacon signal 134 within a defined frequency range with enough accuracy to allow the beacon receiver 100 to track the variations of the beacon signal 134 over time. The beacon receiver 100 tracks the beacon signal 134 after signal acquisition. After acquisition a frequency of the beacon signal 134 frequency may be refined and continuously tracked for variations over time; to provide a stable reference for the Gateway.

The beacon receiver 100 includes a sync manager 126 including an acquisition processor 118 for acquiring a beacon signal, a tracking filter 120 to track an acquired beacon signal, and a control 122. The sync manager 126 may provide statistical reports 132. The statistical reports 132 may include one or more of a RX state, a frequency estimate, a Signal to Noise (SNR) estimate, an RSSI estimate or the like. The control 122 provides acquisition, tracking and outage state control. The control 122 may selectively enable the acquisition processor 118 output an acquisition frequency $f_{acq}$ to initially acquire or to reacquire the $f_{acq}$. After acquisition, the control 122 may selectively enable the tracking filter 120 to initially track or to retrack the $f_{trk}$. The control 122 may determine whether a primary or redundancy signal is to be acquired and tracked based on their respective SNR.

During tracking, the SNR may be provided by an SNR estimator 116. The SNR estimator 116 may be selectively enabled by the control 122 during signal tracking. The beacon receiver 100 may provide SNR and RSSI estimates for every frame processed. The sync manager 126 may receive a Received Signal Strength Indicator (RSSI) estimation from an RSSI estimator 104 that may be made available by the statistical reports 132.

Acquisition Mode

The beacon receiver 100 searches for the beacon signal 134 in a frequency range of the beacon +/−1.5 kHz. The target is to provide an estimate of the frequency and/or a frequency correction of the received beacon signal 134 with an accuracy of +/−10 Hz. The received signal 130, at the output of the SRRC filter 102, is sampled at 4× the symbol rate. During this time, the frequency correction value ($f_{correction}$), that controls the NCO 110 (numerically controlled oscillator), is set to 0 Hz.

A DFT frequency estimator 112 provide a frequency estimate ($f_{acq}$) and a confidence indication of the frequency estimate accuracy. The frequency estimate and confidence indication may be provided for every frame processed.

The acquisition processor 118 collects M frequency acquisition estimates and their corresponding acquisition flags to determine if a successful acquisition has occurred and provides an initial frequency correction value ($f_{correction}$). During acquisition, the SNR may be provided by the acquisition processor 118. The control 122 may provide a frequency correction $f_{correction}$ to control an output of a (NCO) 110 when tracking.

Tracking Mode

In tracking mode, the beacon receiver 100 refines an acquisition frequency estimate and tracks the frequency variations over time. The frequency estimation may have a range of +/−50 Hz with 1 Hz resolution. As discussed above, the acquisition mode may provide an initial value for $f_{correction}$. The residual frequency error on the beacon signal may be +/−10 Hz after the initial $f_{correction}$. A DFT processor 114 improves the accuracy of this estimate with the finer resolution of a DFT processor 114. A frequency estimate ($f_{est}$) from the DFT frequency estimator 112 goes through a DFT processor 114 to a 1st order tracking filter 120 to produce a filtered frequency estimate $f_{trk}$ and a filter state 136. SNR estimates may be computed from the received signal 130. After a transition period, where the tracking filter 120 adapts to the received signal 130, the control 122 may enable outage detection to monitor the received signal 130. The outage detection may be based on the filter state 136.

The filtered frequency estimate (either as $f_{acq}$ or $f_{trk}$), the filter state 136 and the outage flag are inputs to the control 122 for frequency synchronization management. The control 122 oversees the selection of the appropriate frequency correction value ($f_{correction}$), determined given the current conditions as $$f_{correction} = f_{correction_{acq}} + f_{correction_{tracking}}$$

Acquisition Frequency Estimation

Figure 1B:
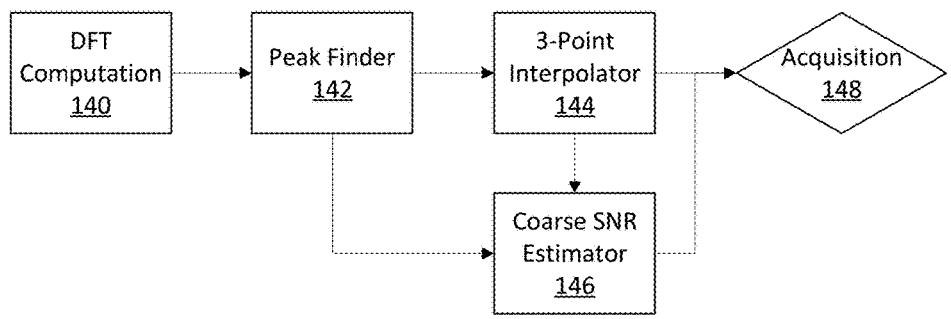
FIG. 1B illustrates the acquisition processor according to various embodiments.

FIG. 1B illustrates the acquisition processor according to various embodiments.

During acquisition, the acquisition processor 118 finds the beacon signal 134 within a frequency range of +/1.5 kHz using the DFT frequency estimator 112 to the DFT beacon signal 134 across bins in a DFT computation 140, for example, 103 bins of 30 Hz (step size) each for +/−1.5 kHz beacon for 20 k trials. The bins in the DFT computation 140 may be searched using a peak finder 142 by the DFT processor 114. The frequency offset lies within one of the bins in the DFT computation 140 found to include the peak by the DFT processor 114. In some embodiments, a 3-point interpolator 144 is used to improve the accuracy of the frequency offset ($f_{acqi}$) based on the peak. The output of the DFT processor 114 and a location of the peak may be used to compute a coarse SNR estimate with the coarse SNR estimator 146. The coarse SNR estimator 146 may be used by the DFT processor 114 to decide signal acquisition 148 to indicate that the signal has been detected and report the same.

Acquisition DFT Processing

When using the DFT for frequency estimation, there is a trade-off between the number of bins, the frequency range (aperture), and processing complexity. The processing complexity is directly proportional to the number of bins used. The bin size is the ratio of the beacon frequency range and the number of bins; hence, a larger bin size covers the beacon frequency range when a small number of bins is used. On the other hand, using a larger bin size, increases a frequency estimate error that can be up to ±½ of the bin size even at high SNR, due at least in part to bin quantization.

Interpolation techniques may minimize a bin quantization error. Three-point Lagrange interpolation is a common interpolation choice that can minimize the bin quantization error over a small range. For the Three-point Lagrange interpolation, the table below shows the number of bins needed to cover a frequency range of +/−1.5 kHz for different bin sizes.

| Bin size Hz | Approx. Freq. Est. Error Hz | Number of bins |
|---|---|---|
| 1 | 4.11E−04 | 3003 |
| 6 | ~0.1 | 503 |
| 30 | ~11.0 | 103 |

Figure 2A:
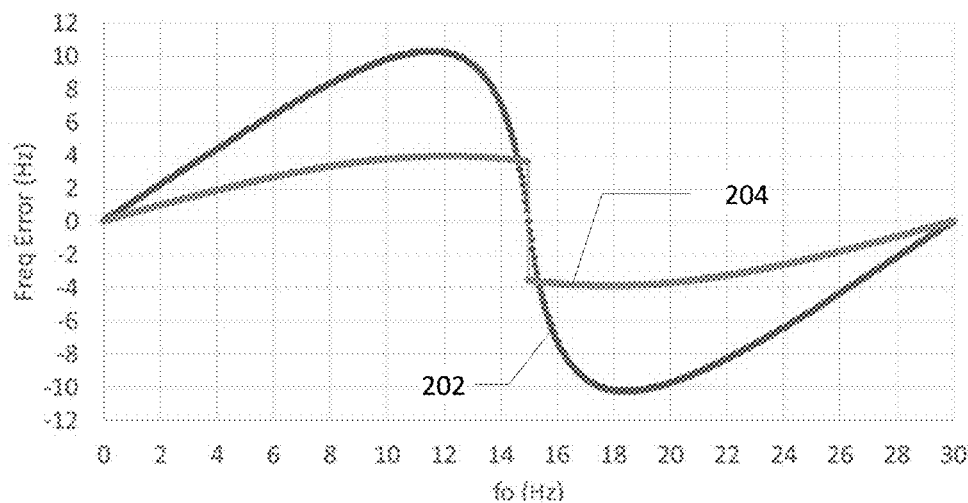
FIG. 2A illustrates a comparison of frequency error for various interpolation techniques for a 30 Hz bin according to various embodiments.

FIG. 2A illustrates a comparison of frequency error for various interpolation techniques for a 30 Hz bin according to various embodiments.

FIG. 2A illustrates a plot 200 of frequency errors for various interpolation techniques for a 30 Hz bin. For the same bin size, Generalized Complex Lagrange interpolation (GCL) reduction 204 for a frequency error is greatly reduced in comparison with the Lagrange interpolation reduction 202 of the frequency error.

Linearization of the frequency error can further minimize the number of bins. Linearization of the GCL frequency error removes the bias of the frequency estimate (accurate estimation). Linearization of the GCL frequency error allows the use of a smaller number of bins, thus minimizing a processing complexity, without sacrificing performance. In some embodiments, a lookup table may be used for the linearization. For Lagrange interpolation, error compensation can only be achieved for the frequency offset range of 12≤fo≤18 Hz due to the response of the Lagrange interpolation error. In contrast, for GCL interpolation, error compensation can be achieved for the full bin size range (0≤fo≤30 Hz) due to the response of the GCL interpolation error.

Figure 2B:
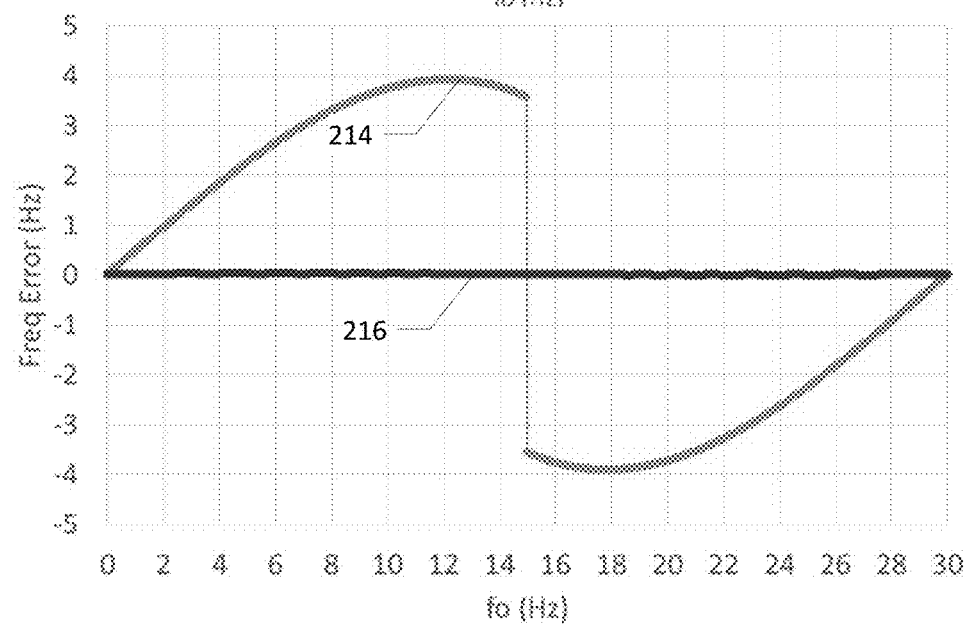
FIG. 2B illustrates a comparison of frequency error for GCL interpolation and linearized GCL interpolation for a 30 Hz bin according to various embodiments.

FIG. 2B illustrates a comparison of frequency error for GCL interpolation and linearized GCL interpolation for a 30 Hz bin according to various embodiments.

FIG. 2B illustrates a plot 210 of frequency errors for GCL interpolation and linearized GCL interpolation for a 30 Hz bin. For the same bin size, frequency error 214 after linearized GCL interpolation.

Figure 2C:
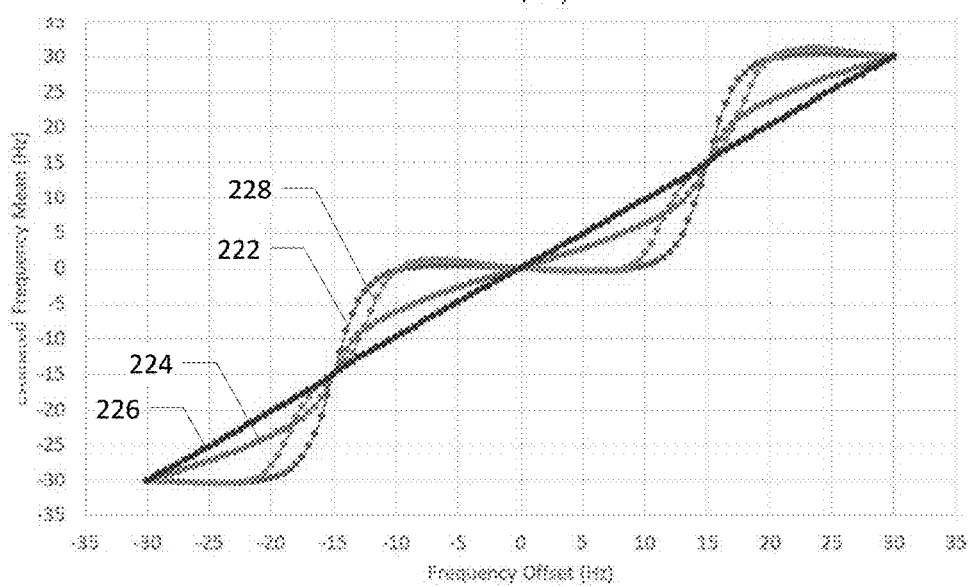
FIG. 2C illustrates frequency estimation performance for various techniques according to various embodiments.

FIG. 2C illustrates frequency estimation performance for various techniques according to various embodiments.

FIG. 2C illustrates a plot 220 of frequency means for various techniques. For the same bin size, a Lagrange interpolation mean 222, a linearized Lagrange interpolation mean 228, a GCL mean 224 and a linearized GCL mean 226 are illustrated. The linearized GCL mean 226 outperforms the other means, while maintaining small processing complexity (small number of bins).

Figure 3A:
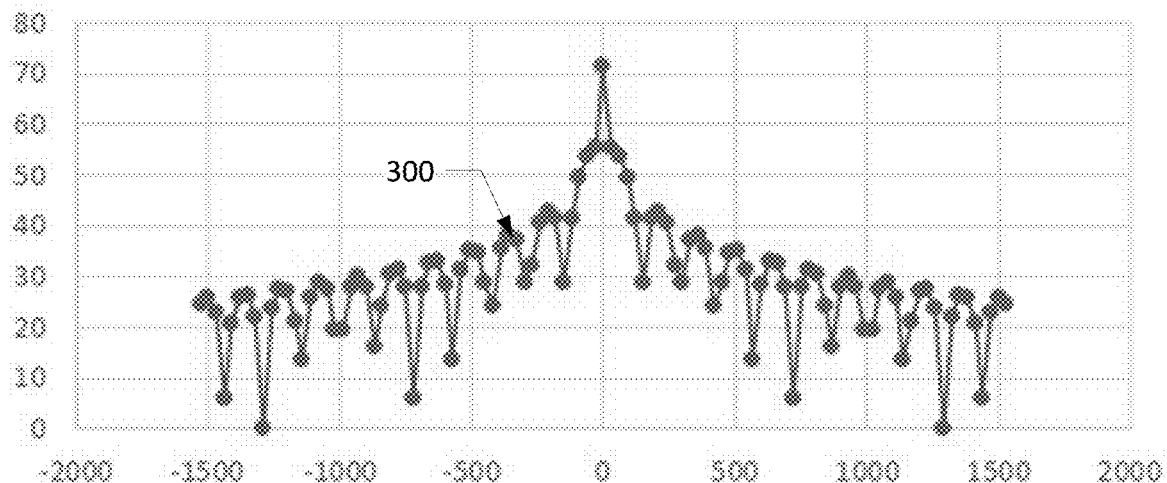
FIG. 3A illustrates a frequency response of a received signal using a beacon receiver of the present teachings under a no impairments condition according to various embodiments.

FIG. 3A illustrates a frequency response of a received signal using a beacon receiver of the present teachings under a no impairments condition according to various embodiments.

FIG. 3A illustrates an acquisition frequency estimate 300 at 0 Hz having no impairments using a beacon receiver of the present teachings. The vertical axis of FIG. 3A illustrates a signal dB at a DFT, while the horizontal axis illustrates frequency in Hz.

Figure 3B:
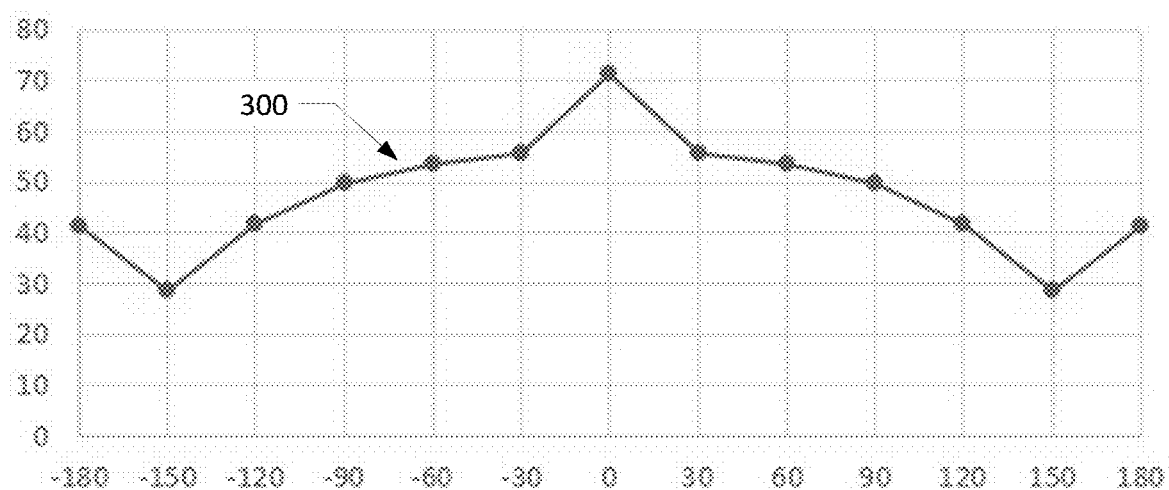
FIG. 3B illustrates a zoomed in version of the frequency response of FIG. 3A according to various embodiments.

FIG. 3B illustrates a zoomed in version of the frequency response of FIG. 3A according to various embodiments.

Interpolation

Figure 4A:
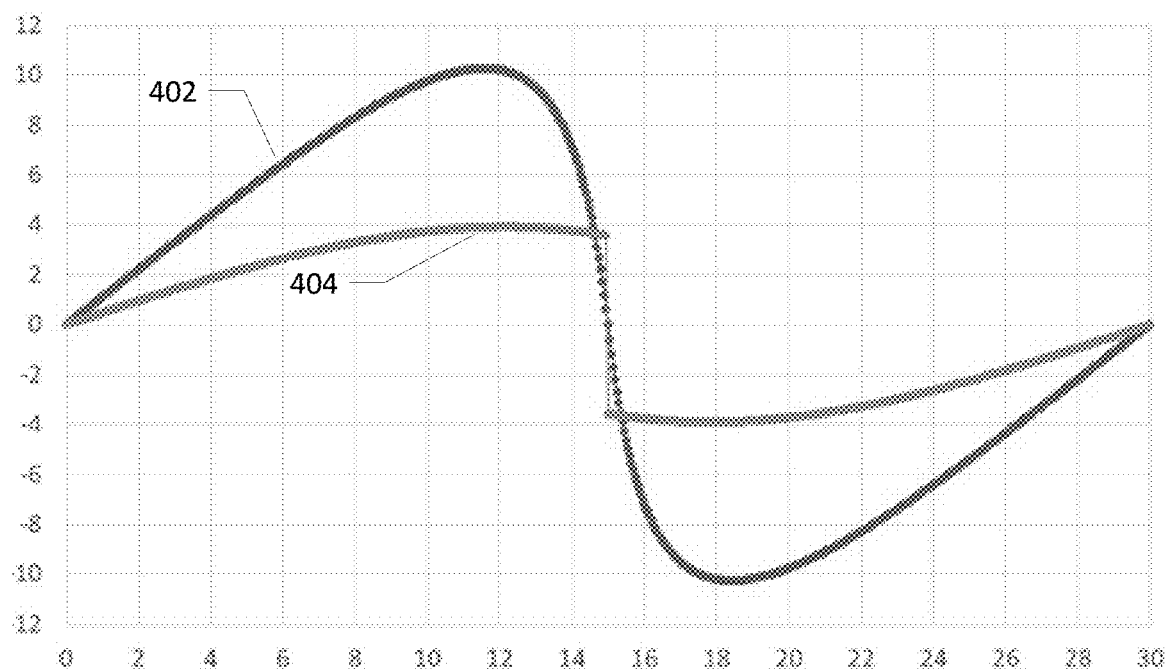
FIG. 4A illustrates a maximum error of 3-point Lagrange interpolation and GCL RMS interpolation for a 30 Hz bin, according to various embodiments.

FIG. 4A illustrates a maximum error of 3-point Lagrange interpolation and GCL RMS interpolation for a 30 Hz bin, according to various embodiments.

To improve the accuracy of the frequency offset determined from the peak of the DFT, interpolation techniques are commonly used. Three-point Lagrange interpolation is a common choice. Using simulation, the 3-point Lagrange interpolation 402 has a maximum error of +/−10.26 Hz when applied to a 30 Hz bin. A 3-point Generalized Complex Lagrange (GCL) interpolation 404 is also plotted in FIG. 4A. A comparison of the residual error between the 3-point Lagrange interpolation 402 and the GCL interpolation 404 illustrates that the 3-point GCL interpolation 404 has a max error of +/−4 Hz with an RMS error of 2.95 Hz. The vertical axis of FIG. 4A illustrates frequency error in Hz, while the horizontal axis illustrates reference frequency ($f_0$) in Hz.

Let X[i] be the complex output of the DFT for bin i, and let k represent the index where the DFT peak is found. Then the GCL interpolation method is defined as $$\delta = \Gamma * \frac{(\text{Re}\{X[k-1]\} - \text{Re}\{X[k+1]\}) * (2\text{Re}\{X[k]\} - \text{Re}\{X[k-1]\} - \text{Re}\{X[k+1]\})}{S} + \frac{(\text{Im}\{X[k-1]\} - \text{Im}\{X[k+1]\}) * (2\text{Im}\{X[k]\} - \text{Im}\{X[k-1]\} - \text{Im}\{X[k+1]\})}{S}$$

where 0<Γ≤1, and $$S = (2\text{Re}\{X[k]\} - \text{Re}\{X[k-1]\} - \text{Re}\{X[k+1]\})^2 + (2\text{Im}\{X[k]\} - \text{Im}\{X[k-1]\} - \text{Im}\{X[k+1]\})^2$$

In some embodiments, the error function of the GCL interpolator may be compensated for using a lookup table with linear interpolation between table entries.

Figure 4B:
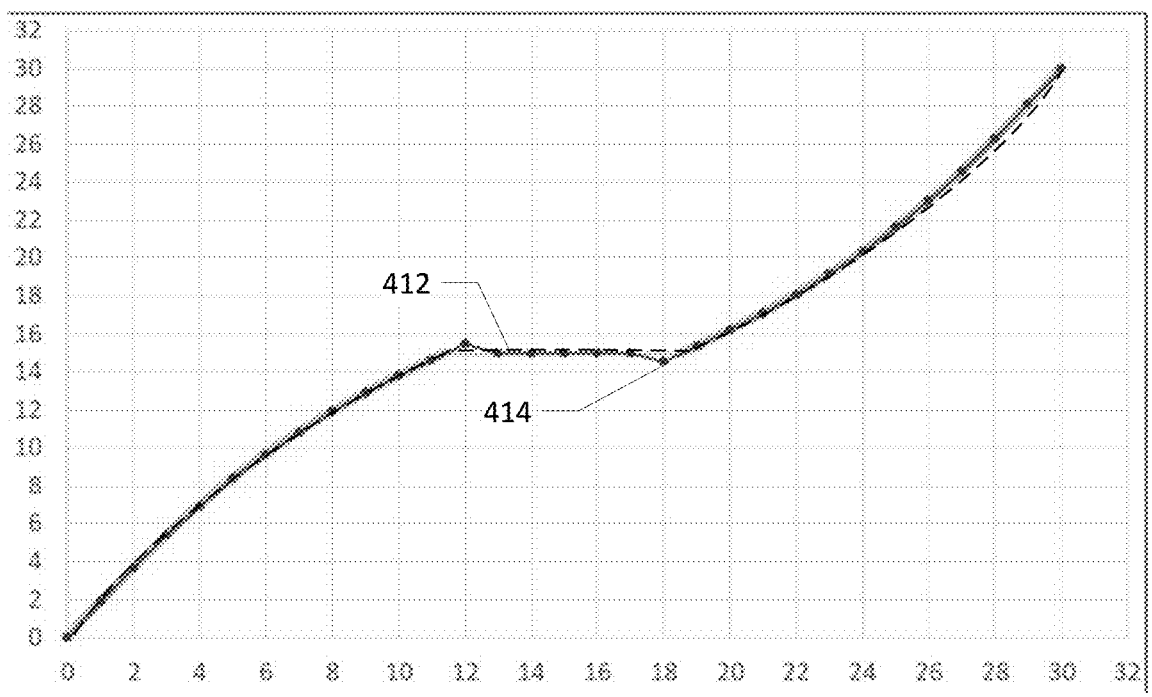
FIG. 4B illustrates a correction of the GCL interpolator, according to various embodiments.

FIG. 4B illustrates a correction of the GCL interpolator 414 (line with dots) and a compensation value 412 (dashed line). The vertical axis of FIG. 4B illustrates reference frequency ($f_0$) in Hz, while the horizontal axis illustrates a frequency estimate ($f_{est}$).

Coarse SNR Estimation

Let X[i] be the complex output for bin i of the DFT. Let k represent the index where the DFT peak is located. Then, the signal power is computed as $$S = |X[k-1]|^2 + |X[k]|^2 + |X[k+1]|^2$$

The noise power is computed as the power in all the DFT bins except those used to compute the signal power, e.g., $$N = \sum_{\text{for all } i \text{ except } i=k-1,k,k+1} |X[i]|^2$$

Then $$SNR = 10 * \log_{10}\left(\frac{S}{N}\right)$$

Figure 5A:
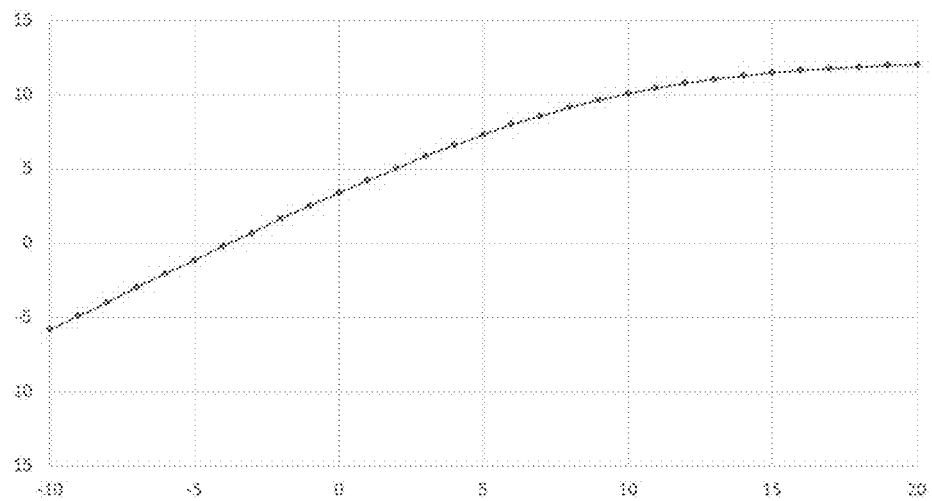
FIG. 5A illustrates a computed coarse SNR estimate for an SNR sweep from −10 dB to 20 dB in steps of 1 dB, with 1000 frames per SNR, according to various embodiments.

FIG. 5A illustrates a computed coarse SNR estimate for an SNR sweep from −10 dB to 20 dB in steps of 1 dB, with 1000 frames per SNR, according to various embodiments.

Figure 5B:
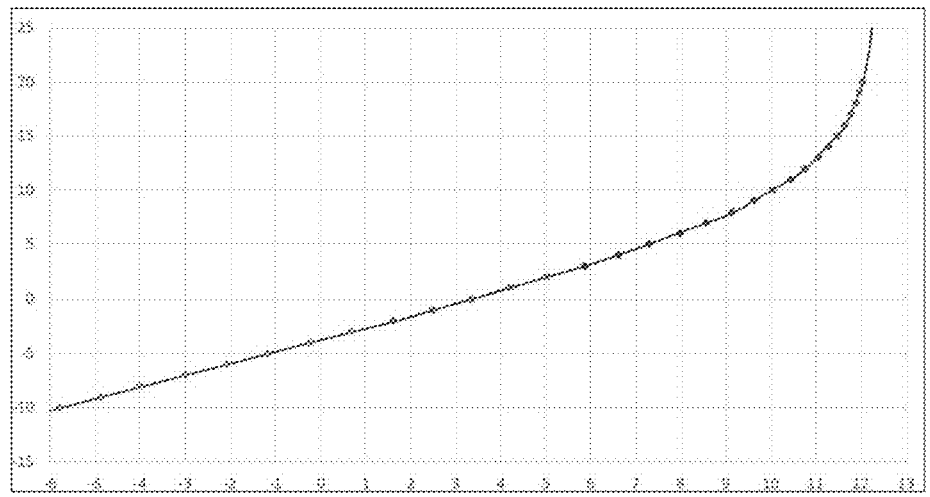
FIG. 5B illustrates a linearization of the SNR estimate of FIG. 5A.

FIG. 5B illustrates a linearization of the SNR estimate of FIG. 5A.

In some embodiments, the SNR estimate may be linearized. The SNR Estimation response may be split in multiple segments for linearization. All segments may use linear approximations. In FIG. 5A, the vertical axis illustrates the SNRest in dB and illustrates the horizontal axis the SNR in dB. In FIG. 5B, the vertical axis illustrates the SNR in dB and the horizontal axis illustrates the SNRest in dB.

Figure 5C:
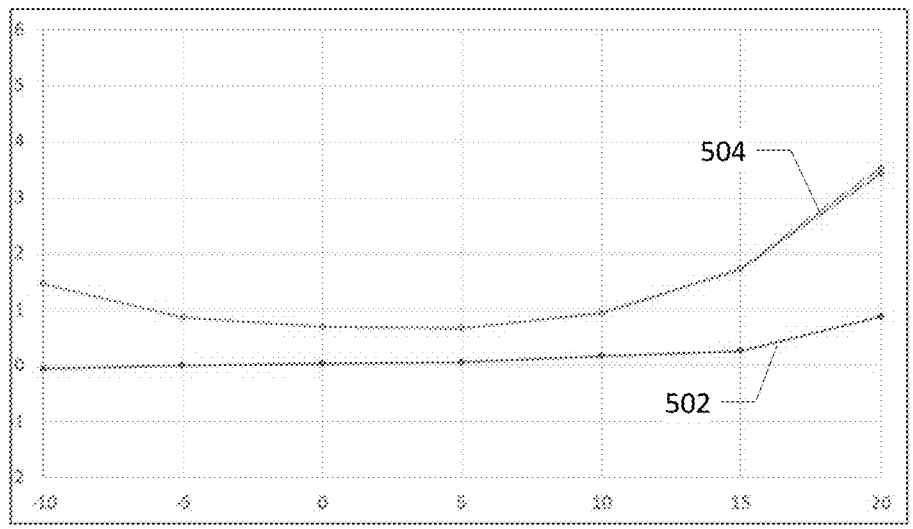
FIG. 5C illustrates a coarse SNR estimation performance of the SNR estimator, according to various embodiments.

FIG. 5C illustrates a coarse SNR estimation performance of the SNR estimator, according to various embodiments.

The vertical axis of FIG. 5C illustrates the coarse SNR estimator bias, standard deviation and RMS in dB and the horizontal axis is the SNR in dB. Line 502 plots the bias, while line 504 plots the standard deviation; the RMS generally overlaps line 504.

Acquisition Success Probability

In some embodiments, the linearized coarse SNR estimate may be used to declare a successful acquisition. A successful acquisition occurs when the frequency error is within 10 Hz of the expected value.

Figure 6:
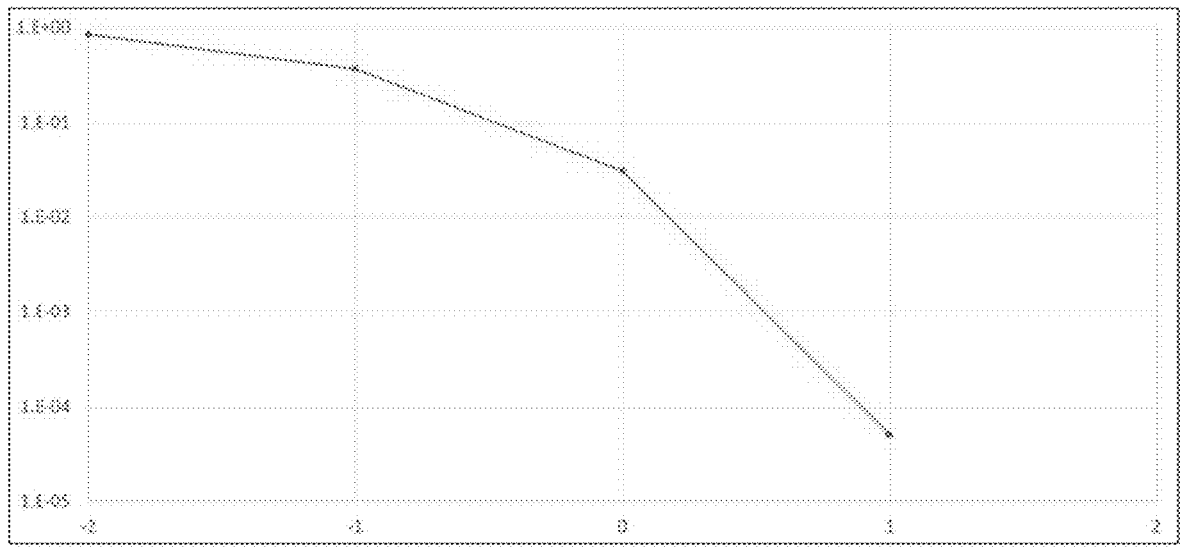
FIG. 6 illustrates a probability of miss detection when the acquisition detection threshold is set to −1 dB for the selected threshold level for 20 k trials.

FIG. 6 illustrates a probability of miss detection when the acquisition detection threshold is set to −1 dB for the selected threshold level for 20 k trials.

In FIG. 6, the vertical axis plots a miss detection probability, and the horizontal axis plots the SNR in dB. As seen from FIG. 6, even with a mere 1 dB signal, a probability of miss detection is less than $10^{-4}$.

Acquisition to Tracking Transition

The Acquisition algorithm collects M frequency acquisition estimates and their corresponding acquisition flags to determine if a successful acquisition has occurred and provides $f_{correction\_acq}$. Let $f\_acq_i$ and $acq\_flag_i$ be the acquisition frequency estimate and acquisition flag for frame i. Then, $$acq\_flag_i = \begin{cases} 1 & \text{individual acquisition success} \\ 0 & \text{failure} \end{cases}$$

$$beacon\_detection\_flag_i = \prod_{k=i-M+1}^{i} acq\_flag_k$$

In some embodiments, the default value of M is 5. When beacon_detection_flag=0, acquisition has failed; and the beacon receiver continues trying to acquire. When beacon_detection_flag=1, then there was a successful acquisition, and the receiver moves on to tracking mode using the acquisition frequency correction as initial frequency correction:

$$f_{correction\_acq} = \frac{1}{M} \sum_{i=0}^{M-1} f\_acq_i$$

Tracking—Frequency Estimation

During tracking mode, the receiver may refine the frequency offset calculated by the acquisition stage. In addition, the receiver oversees tracking frequency variations over time, for example, in the range +/−50 Hz. The receiver may use the same DFT algorithm used during acquisition, except that the step size may be changed to 1 Hz. The DFT may be followed by an interpolation routine to refine the frequency estimate.

Figure 7B:
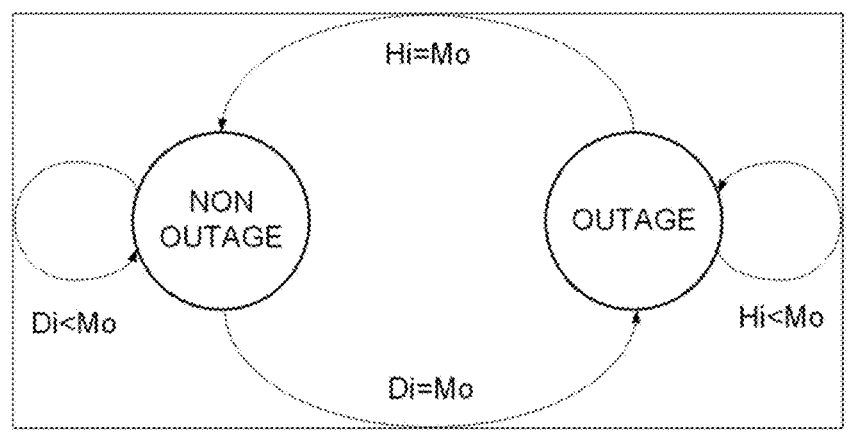
FIG. 7B illustrates outage detection state transitions according to various embodiments.
Figure 7:
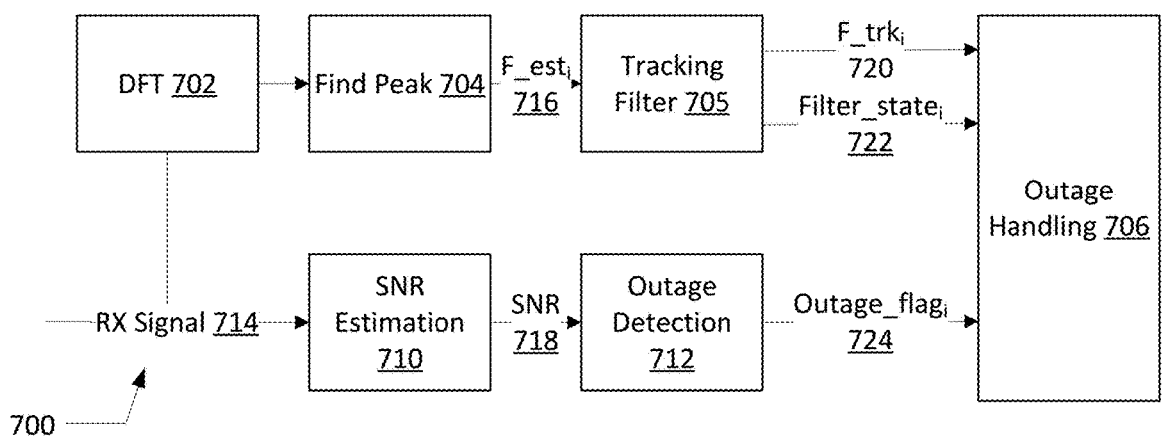
FIG. 7 illustrates a method for a receiver to oversee tracking frequency estimation over time, according to various embodiments.

FIG. 7 illustrates a method for a receiver to oversee tracking frequency estimation over time, according to various embodiments.

A method 700 for a receiver to oversee tracking frequency estimation over time may be used for a RX signal 714. In some embodiments, the RX signal 714 may include a 4×23.4 ksps signal. The RX signal 714 may be provided to a DFT 702. For tracking frequency variations, the method 700 may use a find granularity for frequency ranges across the same number of bins as for acquisition, for example, 103 bins with a 1 Hz step size. An output of the DFT 702 may be interpolated for a find peak operation 704 to provide $F\_est_i$ signals 716 across the bins. The $F\_est_i$ signals 716 may be provided to a tracking filter 705. The tracking filter 705 outputs $F\_trk_i$ signals 720 and $Filter\_state_i$ signals 722 to outage handling 706. The RX signal 714 may be provided to an SNR estimation 710 that provides an SNR 718 to outage detection 712. The outage detection 712 may provide outage_flag$_i$ signals 724 to the outage handling 706. The selected 103 bins of 1 Hz each may cover a range of +/−50 Hz to meet tracking objectives.

The DFT 702 may be the DFT frequency estimator 112, the find peak operation 704 and the interpolation may be the DFT processor 114, the tracking filter 705 may be the tracking filter 120, the SNR estimation 710 may be the SNR estimator 116 and the outage detection 712 may be the control 122.

The bins are searched to find the peak, and the frequency offset lies within the bin found. A 3-point interpolation technique may be used to further refine the frequency offset ($f\_est_i$). The frequency offset is the input to the tracking filter. In a parallel path, the received signal is directly processed to estimate the SNR. Finally, an outage detection algorithm monitors the received signal to control the filter state and the frequency correction ($f\_correction_i$) in case of an outage.

To improve the accuracy of the frequency estimate determined from the peak of the DFT, interpolation techniques are used. A 3-point Lagrange interpolation error is small due to the size of the bin (1 Hz), there is no need of further processing. Using simulation, it was determined that the 3-point Lagrange interpolation has a maximum error of +/−0.00041 Hz when applied to a 1 Hz bin. In some embodiments, the same implementation of the Generalized Complex Lagrange interpolator can be used for the Lagrange interpolation by setting the imaginary part to zero and scaling the output by a constant.

Figure 7A:
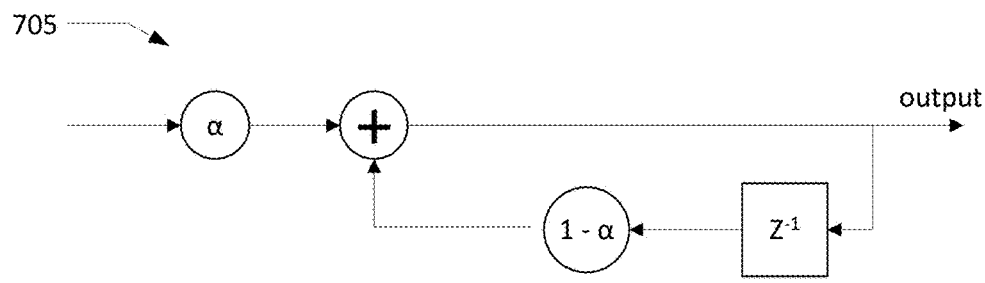
FIG. 7A illustrates the tracking filter of FIG. 7, according to various embodiments.

FIG. 7A illustrates the tracking filter of FIG. 7, according to various embodiments.

The tracking filter 705 of FIG. 7 may be a $1^{st}$ order tracking filter to process the frequency estimates. The structure of the tracking filter 705 is illustrated in FIG. 7A according to various embodiments. Different values of α may be used. Based on results observed for constant frequency and for tracking a varying frequency, the value of α=0.1 may be used in some embodiments.

SNR Estimation

The SNR estimation while in tracking mode, may operate at a known symbol rate. This reduces the amount of processing and provides the SNR per symbol for a received frame. Linearization techniques may be used to improve the SNR estimate. Let $r_{4i}$, $r_{4i+1}$, $r_{4i+2}$, $r_{4i+3}$ be 4 received samples, at a symbol rate of 4×23.4 ksps, for example. They may be combined to form the i-th complex symbol $X_i$ as follows $$\mathrm{Re}\{X_i\} = \mathrm{Re}\{r_{4i}\} + \mathrm{Re}\{r_{4i+1}\} + \mathrm{Re}\{r_{4i+2}\} + \mathrm{Re}\{r_{4i+3}\}$$

$$\mathrm{Imag}\{X_i\} = \mathrm{Imag}\{r_{4i}\} + \mathrm{Imag}\{r_{4i+1}\} + \mathrm{Imag}\{r_{4i+2}\} + \mathrm{Imag}\{r_{4i+3}\}$$

When the receiver operates in frames of 40 ms, the number of symbols to be processed is K=936. Let $$\hat{x} = \frac{1}{K}\sum_{i=0}^{K-1} \mathrm{Re}\{X_i\}$$

$$\hat{y} = \frac{1}{K}\sum_{i=0}^{K-1} \mathrm{Imag}\{X_i\}$$

$$N_{real} = \frac{1}{K}\sum_{i=0}^{K-1} (\mathrm{Re}\{X_i\} - \hat{x})^2$$

$$N_{imag} = \frac{1}{K}\sum_{i=0}^{K-1} (\mathrm{Imag}\{X_i\} - \hat{y})^2$$

Then, the signal power S, the noise power N and the SNR are computed as $$S(\hat{x})^2 + (\hat{y})^2$$

$$N = N_{real} + N_{imag}$$

$$SNR = 10 * \log_{10}\left(\frac{S}{N}\right)$$

Outage Detection and Handling

FIG. 7B illustrates outage detection state transitions according to various embodiments.

Outage detection is based on the SINR estimate computed while in tracking mode. The following table lists exemplary parameters for outage handling.

| | | |
|---|---|---|
| SINR threshold for entering outage | $T_{h0}$ | −9 dB |
| SINR threshold for exiting outage | $T_{h1}$ | −7.5 dB |
| Number of observations | $M_o$ | 5 |

Outage detection may enter an outage state for an ith signal-to-interference and noise ratio $SINR_i$, and an observation is made by comparing $SINR_i$ with a threshold, $$E_i = \begin{cases} 1 & \text{single ``outage'' event if } SINR_i < T_{h0} \\ 0 & \text{otherwise} \end{cases}$$

Multiple consecutive observations may contribute to an outage detection, as $$D_i = \sum_{k=i-M_0+1}^{i} E_k$$

In some embodiments, an "outage" is declared when: $D_i = M_0$.

Once in outage, determination of when to exit the outage stage may compare $SINR_i$ with a threshold, $$L_i = \begin{cases} 1 & \text{single ``out of outage'' event if } SINR_i > T_{h1} \\ 0 & \text{otherwise} \end{cases}$$

Multiple consecutive determinations may contribute to one detection, as $$H_i = \sum_{k=i-M_0+1}^{i} L_k$$

and "exiting an outage" may be declared when $H_i = M_0$.

Outage handling may be varied. For example, while not in the outage state, $$\text{if } E_i = \begin{cases} 0 & \text{Save the filter state } Fs \\ 1 & \text{Do nothing} \end{cases}$$

While in the outage state, the tracking filter state may be frozen to the last known good state. Thus when, $$\text{if } L_i = \begin{cases} 0 & \text{Set the filter to the saved state } Fs \\ 1 & \text{Do nothing} \end{cases}$$

This ensures that when exiting outage, the tracking filter resumes operation from a good known state. For example, after Mo single "outage" detections, the "outage" flag is raised by outage detection 712. Initially when the outage occurs, random values may be reported at the filter output, but as soon as the outage flag is raised, the filter output is set to a last known good state. It remains there until the outage ends. Afterward the tracking resumes with the last known good state.

1000 simulations of a 10 s outage scenario, e.g., 10 s normal reception, 10 s outage, 10 s normal reception resulted in the outage detection probability shown in the table below.

|  | OUTAGE | | NON-OUTAGE | |
|---|---|---|---|---|
| SINR (dB) | Miss Detection (%) | False Detection (%) | Miss Detection (%) | False Detection (%) |
| 16 | 0.0 | 0.0 | 0.0 | 0.0 |
| 6 | 0.0 | 0.0 | 0.0 | 0.0 |
| 1 | 0.0 | 0.0 | 0.0 | 0.0 |

RSSI Estimation

An RSSI estimation may be performed the same whether in acquisition mode or in tracking mode. In some embodiments, the estimator operates at the symbol rate. Let $r_{4i}$, $r_{4i+1}$, $r_{4i+2}$, $r_{4i+3}$ be 4 received samples, at symbol rate 4×23.4 ksps. The 4 received samples may be combined to form the ith complex symbol $X_i$ as follows $$Re\{X_i\}=Re\{r_{4i}\}+Re\{r_{4i+1}\}+Re\{r_{4i+2}\}+Re\{r_{4i+3}\}$$

$$Imag\{X_i\}=Imag\{r_{4i}\}+Imag\{r_{4i+2}\}+Imag\{r_{4i+3}\}$$

Since the receiver operates in frames of 40 ms, the total number of symbols to be processed in a frame is K=936. Then $$RSSI = 10*\log_{10}\left(\frac{1}{K}\sum_{i=0}^{K-1}\left((Re\{X_i\})^2 + (Imag\{X_i\})^2\right)\right).$$

In some embodiments, the RSI estimation response may be linearized. The RSSI response is linearized by breaking the response in 4 segments.

Figure 8A:
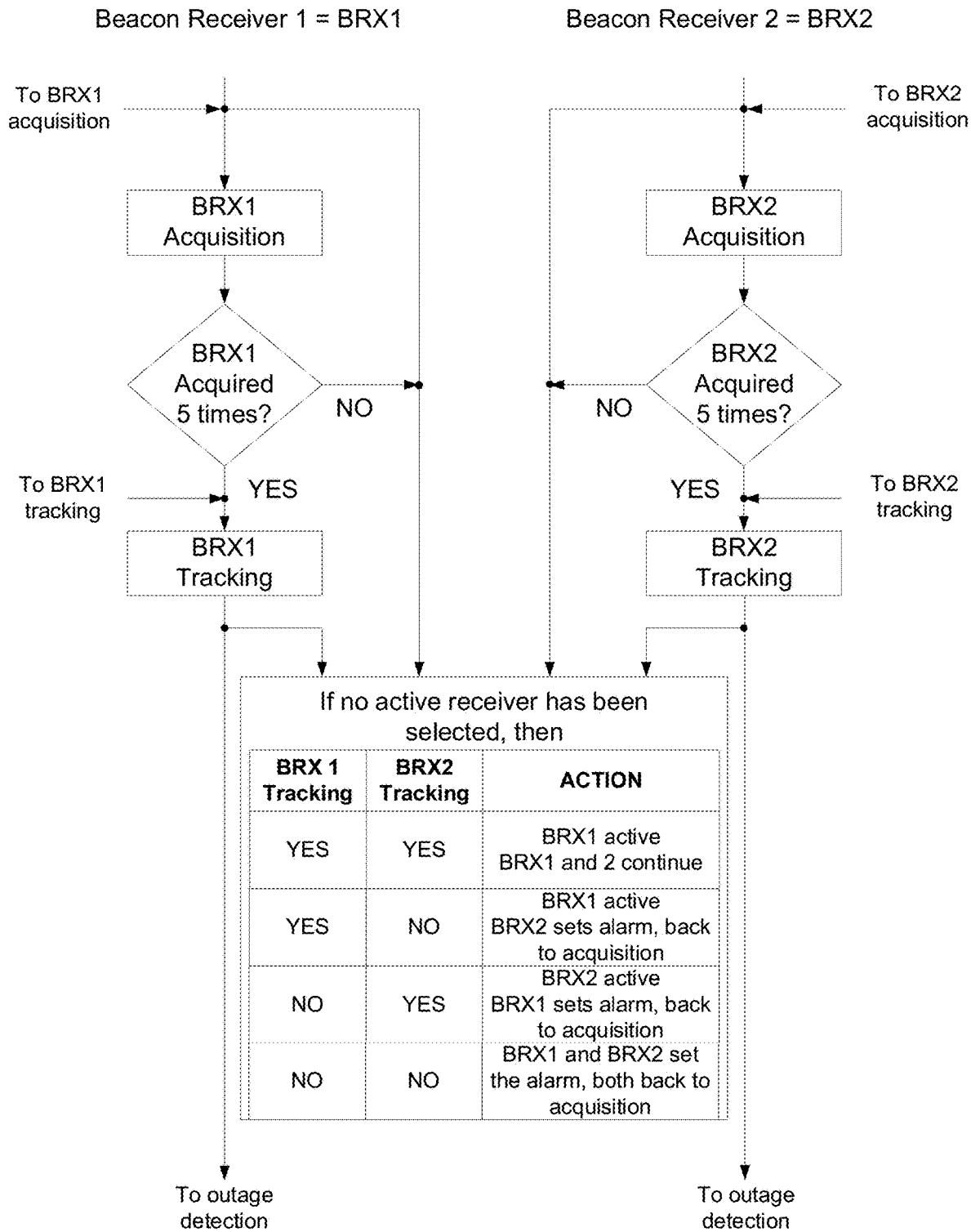
FIG. 8A illustrates a method to track and acquire redundant beacon signals according to various embodiments.

FIG. 8A illustrates a method to track and acquire redundant beacon signals according to various embodiments.

Figure 8B:
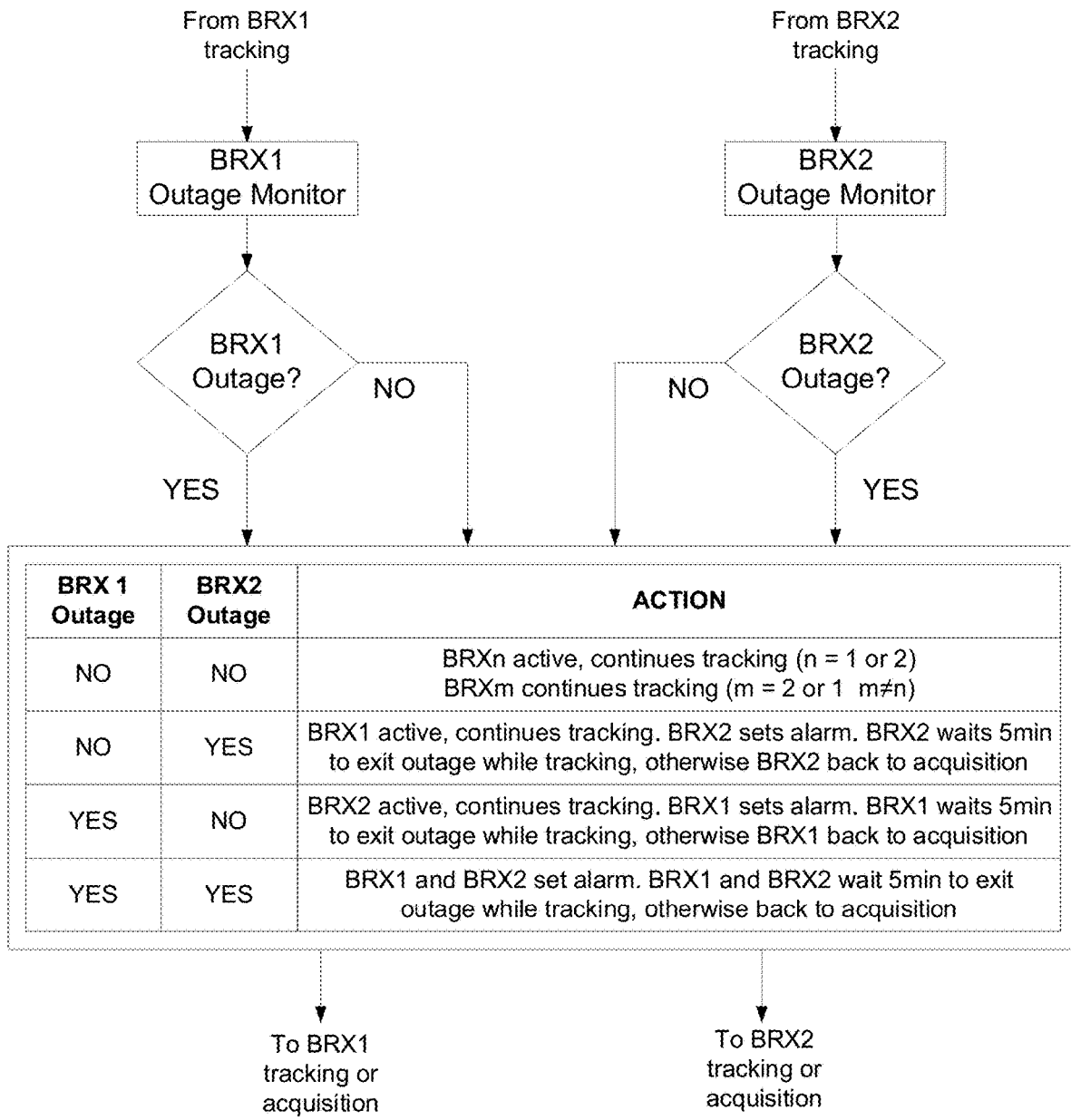
FIG. 8B illustrates a method to track and acquire redundant beacon signals according to various embodiments.

FIG. 8B illustrates a method to track and acquire redundant beacon signals according to various embodiments.

Figure 9:
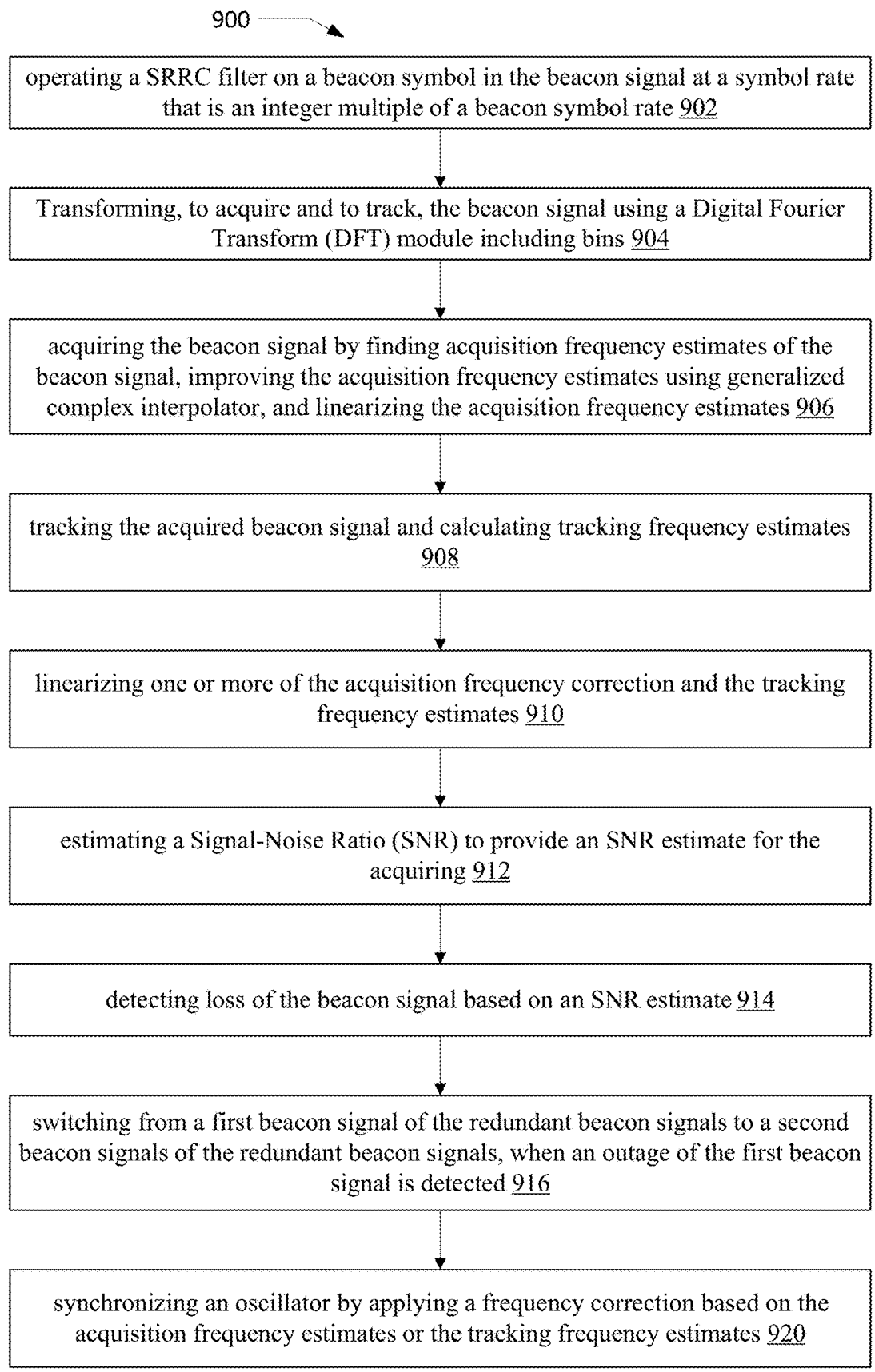
FIG. 9 illustrates a flowchart of a method for receiving a beacon signal, according to various embodiments.

FIG. 9 illustrates a flowchart of a method for receiving a beacon signal, according to various embodiments.

FIG. 9 illustrates a flowchart of a method 900 for receiving a beacon signal. The method 900 may include, at step 902, operating a SRRC filter on a beacon symbol in the beacon signal at a symbol rate that is an integer multiple of a beacon symbol rate. The method 900 may include, at step 904, transforming, to acquire and to track, the beacon signal using a Digital Fourier Transform (DFT) module including bins. The method 900 may include, at step 906, acquiring the beacon signal by finding acquisition frequency estimates of the beacon signal, improving the acquisition frequency estimates using generalized complex interpolator, and linearizing the acquisition frequency estimates. The method 900 may include, at step 908, tracking the acquired beacon signal and calculating tracking frequency estimates. The method 900 may include, at step 910, linearizing one or more of the acquisition frequency estimates and the tracking frequency correction. The method 900 may include, at step 912, estimating a Signal-Noise Ratio (SNR) to provide an SNR estimate for the acquiring. The method 900 may include, at step 914, detecting loss of the beacon signal based on an SNR estimate. The method 900 may include, at step 916, switching from a first beacon signal of the redundant beacon signals to a second beacon signals of the redundant beacon signals, when an outage of the first beacon signal is detected. The method 900 may include, at step 916, synchronizing an oscillator by applying a frequency correction based on the acquisition frequency estimates or the tracking frequency estimates.

Although the subject matter has been described in language specific to structural features and/or methodological acts, it is to be understood that the subject matter in the appended claims is not necessarily limited to the specific features or acts described above. Rather, the specific features and acts described above are disclosed as example forms of implementing the claims. Other configurations of the described embodiments are part of the scope of this disclosure. Further, implementations consistent with the subject matter of this disclosure may have more or fewer acts than as described or may implement acts in a different order than as shown. Accordingly, the appended claims and their legal equivalents should only define the invention, rather than any specific examples given.

We claim:

1. A beacon receiver comprising:
a Digital Fourier Transform (DFT) module comprising bins to acquire and to track a beacon signal;
an acquisition processor to find acquisition frequency estimates of the beacon signal, to improve the acquisition frequency estimates with a generalized complex interpolator and to linearize the acquisition frequency estimates; and
a tracking filter to track the acquired beacon signal and to calculate a tracking frequency estimates; and
a synchronization manager to apply a frequency correction, to an oscillator, based on the acquisition frequency estimates or the tracking frequency estimates,
wherein the DFT module uses a first bin size for the bins to acquire, a second bin size for the bins to track, and the first bin size is greater than the second bin size.

2. The beacon receiver of claim 1, wherein the first bin size is greater than 6 Hz.

3. The beacon receiver of claim 1, wherein a frequency correction error of the first bin size is greater than 0.1 Hz when the beacon signal has a frequency range of +/−1.5 kHz.

4. The beacon receiver of claim 1, further comprising a Square Root Raised Cosine (SRRC) filter operating on a beacon symbol in the beacon signal at a symbol rate that is an integer multiple of a beacon symbol rate.

5. The beacon receiver of claim 1, further comprising a Generalized Complex Lagrange (GCL) interpolator to improve the tracking frequency estimates.

6. The beacon receiver of claim 1, wherein the acquisition processor improves the acquisition frequency estimates with a Generalized Complex Lagrange (GCL) interpolator.

7. The beacon receiver of claim 1, further comprising a Signal-Noise Ratio (SNR) estimator to provide an SNR estimate to the acquisition processor.

8. The beacon receiver of claim 1, further comprising a control to detect loss of the beacon signal and an SNR estimator to provide an SNR estimate to the control.

9. The beacon receiver of claim 6, further comprising a control to restore a known good state for the acquisition processor when transitioning from an outage.

10. The beacon receiver of claim 9, further comprising a beacon redundancy module, wherein the beacon signal comprises redundant beacon signals, and a control to switch from a first beacon signal of the redundant beacon signals to a second beacon signals of the redundant beacon signals, when an outage of the first beacon signal is detected.

11. The beacon receiver of claim 1, wherein the DFT module to acquire the beacon signal and the DFT module to track the beacon signal are same.

12. The beacon receiver of claim 1, wherein the tracking filter is a first order filter having an α feedback control set to 0.1.

13. The beacon receiver of claim 1, wherein the beacon signal comprises a beacon symbol rate of 23.4 kilo symbols per second (ksps) signal, wherein the beacon signal comprises a frame having a duration of less than or equal to 100 ms.

14. The beacon receiver of claim 1, wherein the first bin size is 30 Hz, and wherein the second bin size is 1 Hz.

15. The beacon receiver of claim 1, wherein the beacon signal comprises a satellite beacon signal.

16. The beacon receiver of claim 1, further comprising a Received Signal Strength Indicator (RSSI) estimator to provide a linearized RSSI estimate, wherein the RSSI estimator operates at a signal rate of the beacon signal.

17. A method for receiving a beacon signal comprising:
  transforming, to acquire and to track, the beacon signal using a Digital Fourier Transform (DFT) module comprising bins;
  acquiring the beacon signal by finding acquisition frequency estimates of the beacon signal, improving the acquisition frequency estimates using generalized complex interpolator, and linearizing the acquisition frequency estimates;
  tracking the acquired beacon signal and calculating tracking frequency estimates; and
  synchronizing an oscillator by applying a frequency correction based on the acquisition frequency estimates or the tracking frequency estimates,
  wherein the DFT module uses a first bin size for the bins for the acquiring, a second bin size for the bins for the tracking, and the first bin size is greater than the second bin size.

18. The method of claim 17, further comprising improving the tracking frequency estimates using a Generalized Complex Lagrange (GCL) interpolator.

19. The method of claim 17, wherein a DFT module for acquiring the beacon signal and a DFT module for tracking the beacon signal are same.

20. The method of claim 17, wherein the beacon signal comprises redundant beacon signals, and the method further comprises switching from a first beacon signal of the redundant beacon signals to a second beacon signals of the redundant beacon signals, when an outage of the first beacon signal is detected.

* * * * *